(12) United States Patent
Komatsu et al.

(10) Patent No.: US 6,451,436 B1
(45) Date of Patent: Sep. 17, 2002

(54) COATING LIQUID FOR FORMING A SILICA-CONTAINING FILM WITH A LOW-DIELECTRIC CONSTANT AND SUBSTRATE COATED WITH SUCH A FILM

(75) Inventors: Michio Komatsu; Akira Nakashima; Miki Egami, all of Kitakyushu (JP)

(73) Assignee: Catalysts & Chemicals Industries Co., Ltd. (JP)

( * ) Notice: Subject to any disclaimer, the term of this patent is extended or adjusted under 35 U.S.C. 154(b) by 0 days.

(21) Appl. No.: 09/577,507

(22) Filed: May 24, 2000

Related U.S. Application Data

(63) Continuation of application No. PCT/JP99/04051, filed on Jul. 28, 1999.

(30) Foreign Application Priority Data

Sep. 25, 1998 (JP) .......................................... 10-271157
Apr. 2, 1999 (JP) .......................................... 11-096366

(51) Int. Cl.$^7$ .............................. B32B 9/04; C08L 83/04
(52) U.S. Cl. ................... 428/447; 428/413; 428/474.4; 428/480; 428/500; 106/287.1; 106/287.12; 106/287.13; 106/287.14; 106/287.16; 427/487; 427/489; 427/515; 427/385.5; 427/387; 427/226; 524/858; 524/859; 438/781; 438/782; 438/787
(58) Field of Search .................. 106/287.1, 287.12, 106/287.13, 287.14, 287.16; 428/413, 447, 474.4, 480, 500; 427/385.5, 387, 487, 489, 515, 226; 524/858, 859; 438/787, 781, 782

(56) References Cited

U.S. PATENT DOCUMENTS

| | | | |
|---|---|---|---|
| 3,575,916 A | | 4/1971 | Bockstie, Jr. |
| 3,615,272 A | | 10/1971 | Collins et al. ................ 23/366 |
| 3,666,551 A | | 5/1972 | Bockstie, Jr. |
| 4,277,525 A | * | 7/1981 | Nakayama et al. ......... 427/387 |
| 4,431,701 A | | 2/1984 | Hamada |
| 5,051,298 A | * | 9/1991 | Landry et al. .............. 428/220 |
| 6,000,339 A | | 12/1999 | Matsuzawa |
| 6,204,202 B1 | * | 3/2001 | Leung et al. ............... 438/781 |
| 6,261,357 B1 | * | 7/2001 | Egami et al. ............ 106/287.1 |
| 6,372,666 B1 | * | 4/2002 | Ramos et al. ............... 438/781 |

FOREIGN PATENT DOCUMENTS

| | | |
|---|---|---|
| EP | 1 035 183 A1 * | 9/2000 |
| JP | 47-31838 | 8/1972 |
| JP | (1972) 47-50440 B1 | 12/1972 |
| JP | (1978) 53-48946 A | 5/1978 |
| JP | (1982) 57-63708 A | 4/1982 |
| JP | (1982) 57-105463 A | 6/1982 |
| JP | (1983) 58-037062 A | 3/1983 |
| JP | (1986) 61-103967 A | 5/1986 |
| JP | (1986) 61-283671 A | 12/1986 |
| JP | (1988) 63-137972 A | 6/1988 |
| JP | (1989) 1-144504 A | 6/1989 |
| JP | (1991) 3-41175 A | 2/1991 |
| JP | (1991) 03-263476 A | 11/1991 |
| JP | (1992) 4-323264 A | 11/1992 |
| JP | (1993) 5-179202 A | 7/1993 |
| JP | (1993) 05-263045 A | 10/1993 |
| JP | (1993) 05-315319 A | 11/1993 |
| JP | (1995) 07-066188 A | 3/1995 |
| JP | (1995) 7-252420 A | 10/1995 |
| JP | (1995) 07-330468 A | 12/1995 |
| JP | (1996) 08-283661 A | 10/1996 |
| JP | 08330300 | 12/1996 |
| JP | (1997) 9-283514 A | 10/1997 |
| JP | 09315812 | 12/1997 |
| JP | (1998) 10-140047 A | 5/1998 |
| JP | (1998) 10-279885 A | 10/1998 |
| WO | WO96/00758 A1 | 1/1996 |

OTHER PUBLICATIONS

Derwent English Abstract of WO 99/03926, Jan., 1999, Ioka et al.*
Japanese Abstract, JP 3–243676, published Oct. 30, 1991, Applicant: Sumitomo Electric.

* cited by examiner

Primary Examiner—Robert Dawson
Assistant Examiner—Jeffrey B. Robertson
(74) Attorney, Agent, or Firm—Webb Ziesenheim Logsdon Orkin & Hanson, P.C.

(57) ABSTRACT

A coating liquid for forming a silica-containing film with a low-dielectric constant, which enables the formation of a low-density film having a dielectric constant as low as 3 or less and being excellent not only in resistance of oxygen plasma and in process adaptation but also in adhesion to a substrate and in film strength, is provided. A substrate coated with the silica-containing film having the above characteristics, which is obtained by the use of the above coating liquid, is further provided. The coating liquid for forming a silica-containing film with a low-dielectric constant comprises a polymer composition mainly constituted by (i) a hydrolyzate of at least one alkoxysilane represented by the following formula (I) and/or at least one halogenated silane represented by the following formula (II), and (ii) a readily decomposable resin, $$X_n Si(OR)_{4-n} \quad (I)$$

$$X_n SiX'_{4-n} \quad (II)$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; X' represents a halogen atom; and n is an integer of 0 to 3.

23 Claims, No Drawings

COATING LIQUID FOR FORMING A SILICA-CONTAINING FILM WITH A LOW-DIELECTRIC CONSTANT AND SUBSTRATE COATED WITH SUCH A FILM

CROSS-REFERENCE TO RELATED APPLICATIONS

This application is a continuation of International Patent Application Number PCT/JP99/04051 filed on Jul. 28, 1999, and designating, inter alia, the United States, which claims priority to Japanese Patent Applications Serial No. 10/271157, filed Sep. 25, 1998 and Ser. No. 11/096366, filed Apr. 2, 1999.

FIELD OF THE INVENTION

The present invention relates to a coating liquid for forming a silica-containing film with a low dielectric constant which enables the formation of a low-density film having a dielectric constant as low as 3 or less and being excellent in resistance to oxygen plasma and in process adaptation such as etching performance, and relates to a substrate coated with a silica-containing film which exhibits the above properties.

BACKGROUND OF THE INVENTION

In semiconductor devices with a multi-level integrated circuit designed at the rules of 0.25 micron or less, metal wiring impedance attributed to electrostatic induction is increased because of the narrow spacing between metal wiring layers required for the advanced integration of such semiconductor devices. Thus, a delay in response speed and an increase in power consumption become problems to be resolved. For coping with this, it is necessary to minimize the dielectric constant of the interconnect insulating film disposed between the semiconductor substrate and the metal wiring layer such as an aluminum wiring layer or between metal wiring layers.

The interconnect insulating film disposed for the above purpose is generally formed on a substrate by a vapor phase growth method such as CVD (chemical vapor deposition) method or by a coating method using a conventional coating liquid.

However, it is believed that the dielectric constant of silica-containing film obtained by vapor phase growth methods such as the CVD method is 3.5 (in the case of a fluorine-doped silica film) or higher, and that forming a silica-containing film having a dielectric constant of lower than 3 is difficult. On the other hand, the coating film containing a polyaryl resin, a fluorinated polyimide resin or a fluoro-resin, which is formed on a substrate by the CVD method or the coating method, exhibits a dielectric constant of about 2. However, these films have drawbacks in that not only their adhesion to a substrate surface or to a resist material employed in its processing is poor, but also their resistance to chemicals and oxygen plasma is inferior.

The conventional coating liquid for forming a silica-containing film, which comprises a partial hydrolyzate of alkoxysilane, enables the obtaining of a coating film with a dielectric constant of about 2.5. However, the coating film has a drawback in that its adhesion to a substrate surface is poor.

The inventors of the present invention have found that the silica-containing film obtained from a coating liquid comprising a reaction product between fine particles of silica and a halogenated silane or a hydrolyzate thereof exhibits a dielectric constant as low as 3 or less and is excellent in not only the adhesion to a substrate surface, mechanical strength and chemical resistance such as alkali resistance but also in crack resistance. Based on such findings, a patent application was filed and published as Japanese Patent Laid-open Publication No. 9(1997)-315812.

In order to obtain an insulating film with a low-dielectric constant, it was proposed to form a porous low-density film so as to decrease the dielectric constant. For example, Japanese Patent Laid-Open Publication No. 8(1996)-330300 discloses a process for forming an insulating film with a dielectric constant of not more than 3. According to the invention disclosed in this publication, the insulating film having a low-dielectric constant is formed by applying a coating liquid having dissolved therein a gas-generating substance of organic components such as 5-naphthoquinonediazidosulfonic esters, 4-naphthoquinonediazidosulfonic esters, quinonediazides, diazonium salts, azide compounds, maleic acid derivatives, acetoacetic acid derivatives, diazomeldrum derivatives, t-butoxycarbonic ester derivatives and polybutenesulfone derivatives onto a substrate by SOG (spinning on glass) method, and then heating the thus coated film or irradiating it with radiation to render the film porous.

However, it is known that although an insulating film having a dielectric constant of not more than 3 can be obtained from the coating liquid containing such a gas-generating substance, the adhesion of the resulting film to a substrate and film strength are not always satisfactory.

As a result of various studies made by the inventors of the present invention, it was found that rendering the coating film too porous to attain a low-dielectric constant will cause deterioration of the film quality attributed to the irradiation of oxygen plasma in the process of plasma etching or peeling of a resist material, and such a deterioration tendency is conspicuous particularly in a porous film (including a porous silica-containing film) having pores or voids with a relatively large size.

Under such circumstances as described above, there has been a strong requirement for development of a coating liquid for forming a silica-containing film with a low-dielectric constant, which enables the formation of a low-density insulating film having a dielectric constant as low as 3 or less and being excellent not only in resistance to oxygen plasma and in process adaptation such as etching performance, but also in adhesion to a substrate and in film strength.

SUMMARY OF THE INVENTION

The present invention has been accomplished with a view to solving the above problems of the prior art. Accordingly, the present invention provides a coating liquid for forming a silica-containing film, which enables the formation of a low-density insulating film having a dielectric constant as low as 3 or less and being excellent not only in resistance to oxygen plasma and in process adaptation such as etching performance but also in adhesion to a substrate and in film strength. In addition, the present invention provides a substrate furnished with a silica-containing film having the above properties.

The coating liquid for forming a silica-containing film with a low-dielectric constant according to the present invention comprises a polymer composition mainly constituted by (i) a hydrolyzate of at least one alkoxysilane represented by the following formula (I) and/or at least one halogenated silane represented by the following formula (II), and (ii) a readily decomposable resin, $$X_nSi(OR)_{4-n} \qquad (I)$$

$$X_nSiX'_{4-n} \qquad (II)$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; X' represents a halogen atom; and n is an integer of 0 to 3.

The polymer composition is preferably an interpenetrated polymer composition in which the hydrolyzate and the readily decomposable resin are entangled in each other on the molecular chain level.

The readily decomposable resin is preferably a resin which is decomposed or vaporized by heating at a temperature of not higher than 500° C. or by irradiating with ultraviolet radiation, infrared radiation, electron beam, X-ray or oxygen plasma. Moreover, the readily decomposable resin preferably has a number-average molecular weight of 500 to 50,000 based on polystyrene.

The polymer composition is preferably obtained by performing a catalytic hydrolysis reaction of alkoxysilane and/or halogenated silane in a solution comprising:

(a) at least one alkoxysilane represented by the above formula (I) and/or at least one halogenated silane represented by the above formula (II), and (b) the readily decomposable resin dissolved in an organic solvent being insoluble in water, with addition thereto of water and an acid catalyst, or an aqueous solution containing the acid catalyst.

In the polymer composition, the weight ratio (A/B) of the hydrolyzate of alkoxysilane and/or halogenated silane (A), in terms of $SiO_2$, to the readily decomposable resin (B) is preferably in the range of 1/0.1 to 1/20.

The substrate coated with a silica-containing film with a low-dielectric constant according to the present invention is a low-density film formed by:

applying the above coating liquid for forming a silica-containing film with a low-dielectric constant onto a substrate, heating the thus coated film, and then decomposing or vaporizing the readily decomposable resin contained in the film by a thermal treatment at a temperature of not higher than 500° C. or by an irradiation with ultraviolet radiation, infrared radiation, electron beam, X-ray or oxygen plasma.

In the substrate coated with a silica-containing film with a low-dielectric constant, the average diameter of pores or voids present in the low-density film formed by the above method is preferable to be not more than 5 nm.

DETAILED DESCRIPTION OF THE INVENTION

The coating liquids for forming a silica-containing film with a low-dielectric constant and the substrate coated with such a film according to the present invention are described below in detail.

COATING LIQUID FOR FORMING A SILICA-CONTAINING FILM WITH A LOW-DIELECTRIC CONSTANT

The coating liquid for forming a silica-containing film with a low-dielectric constant according to the present invention comprises a polymer composition, preferably an interpenetrated polymer composition, which is mainly constituted by (i) a hydrolyzate of at least one alkoxysilane and/or at least one halogenated silane as follows, and (ii) a readily decomposable resin.

In the present invention, the hydrolyzate can be obtained by mixing at least one alkoxysilane represented by the following formula (I) and/or at least one halogenated silane represented by the following formula (II) with an organic solvent and hydrolyzing or partially hydrolyzing the alkoxysilane and/or the halogenate silane under the presence of water and a catalyst;

$$X_nSi(OR)_{4-n} \qquad (I)$$

$$X_nSiX'_{4-n} \qquad (II)$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; X' represents a halogen atom; and n is an integer of 0 to 3.

Examples of the alkoxysilanes represented by the above formula (I) include methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane and trifluoromethyltriethoxysilane.

Examples of the halogenated silanes represented by the above formula (II) include trichlorosilane, tribromosilane, dichlorosilane, fluorotrichlorosilane, fluorobromosilane, methyltrichlorosilane, ethyltrichlorosilane, phenyltrichlorosilane and vinyltrichlorosilane.

As for the organic solvents, for example, alcohols, ketones, ethers, esters and hydrocarbons can be used. Specific examples thereof include alcohols such as methanol, ethanol, propanol and butanol; ketones such as methylethylketone and methylisobutylketone; glycol ethers such as methylcellosolve, ethylcellosolve and propyleneglycolmonopropylether; glycols such as ethyleneglycol, propyleneglycol and hexyleneglycol; esters such as methylacetate, ethylacetate, methyllactate and ethyllactate; hydrocarbons such as hexane, cyclohexane and octane; and aromatic hydrocarbons such as toluene, xylene and mesitylene.

As for the catalysts, inorganic acids such as hydrochloric acid, nitric acid and sulfuric acid, and organic acids such as acetic acid, oxalic acid and toluenesulfonic acid, and compounds exhibiting acidity in an aqueous solution such as metallic soap can be used.

In addition, water, which is necessary for the hydrolysis reaction of alkoxysilane or halogenated silane, is preferably added in an amount of 0.1 to 5 mol, more preferably 0.1 to 2 mol, per mol of the Si—OR group or Si—X' group, each of which is a constituent part of the alkoxysilane or halogenated silane respectively. The catalyst is preferably added in an amount of 0.001 to 1 mol, per mol of the alkoxysilane or halogenated silane.

The hydrolysis reaction of alkoxysilane is preferably performed under agitation at a temperature of not higher than 80° C., more preferably 5 to 60° C., for a period of not longer than 10 hours, more preferably 0.5 to 5 hours. The hydrolysis reaction of halogenated silane is preferably performed under agitation at a temperature of not higher than 50° C., more preferably 5 to 20° C., for a period of not longer than 20 hours, more preferably 1 to 10 hours. When the alkoxysilane and the halogenated silane are simultaneously hydrolyzed, the above conditions for the hydrolysis reaction of halogenated silane are preferably selected.

However, the process for preparing such a hydrolyzate or a partial hydrolyzate is not limited to those as described above. For example, a hydrolyzate or a partial hydrolyzate prepared by a convention al process is also employable.

The polymer composition according to the present invention can be directly prepared by performing a catalytic hydrolysis reaction in a solution comprising (i) the alkoxysilane and/or the halogenated silane and (ii) the readily decomposable resin, without subjecting to the stage of preparing the hydrolyzate or partial hydrolyzate, details of which is as described below.

The for use in the present invention has a property of being decomposed or vaporized by heating at a temperature of not higher than 500° C., or by an irradiation with ultraviolet radiation, infrared radiation, electron beam, X-ray or oxygen plasma. Examples of the suitable readily decomposable resins include cellulose resins, polyamide resins, polyester resins, acrylic resins, polyether resins, polyolefin resins, polyol resins and epoxy resins.

The number-average molecular weight of these readily decomposable resins is preferably in the range of 500 to 50,000, more preferably 5,000 to 30,000 based on polystyrene. When the number-average molecular weight of the resin is more than 50,000, pore's or voids with a relatively large size are likely to be formed in the silica-containing film coated on a substrate at the time at which the resin is decomposed or vaporized. As a result, poor adhesion of the resulting film to substrate, lowering of the film strength, soaking of the etching gas components and deterioration of the film quality attributed to the irradiation of oxygen plasma are likely to occur when such a resin is employed. When the number-average molecular weight of the resin is less than 500, a low-density film cannot be formed, and it becomes difficult to lower the dielectric constant of the resulting silica-containing film.

The polymer composition for use in the present invention is a composition mainly constituted by (i) a hydrolyzate of at least one alkoxysilane and/or at least one halogenated silane and (ii) a readily decomposable resin.

The polymer composition is preferably an interpenetrated polymer composition in which the hydrolyzate and the readily decomposable resin are homogeneously entangled in each other on the molecular chain level.

In the polymer composition, the weight ratio (A/B) of the hydrolyzate of alkoxysilane and/or halogenated silane (A), in terms of $SiO_2$, to the readily decomposable resin (B) is preferably in the range of 1/0.1 to 1/20, more preferably 1/0.5 to 1/10.

The polymer composition preferably has a number-average molecular weight of 500 to 50,000, more preferably 1,000 to 30,000 based on polystyrene.

The polymer composition can be prepared by mixing (i) the alkoxysilane and/or halogenated silane with (ii) the readily decomposable resin dissolved in any organic solvents such as ketones, ethers, esters, hydrocarbons and aromatic hydrocarbons.

The solution containing a mixture of (i) the alkoxysilane and/or halogenated silane and (ii) the readily decomposable resin is preferably agitated at a temperature of 20 to 60° C. for a period of 1 to 6 hours under the presence of a small amount of water and an acid catalyst. By agitating it at such a temperature, a secondary hydrolysis reaction of hydrolyzate or partial hydrolyzate proceeds in the skeleton of the readily decomposable resin, thereby obtaining an interpenetrated polymer composition in which the hydrolyzate and the readily decomposable resin are homogeneously entangled. However, there is a possibility that depending on the type of the readily decomposable resins and other conditions to be employed, such a homogeneously entangled composition may be unobtainable.

The polymer composition can be directly prepared by performing a catalytic hydrolysis reaction in a solution comprising (i) the alkoxysilane and/or halogenated silane and (ii) the readily decomposable resin dissolved in an organic solvent being insoluble in water. According to this method, the interpenetrated polymer composition can be easily prepared.

Specifically, such a polymer composition can be directly obtained by performing a catalytic hydrolysis reaction of alkoxysilane and/or halogenated silane in a solution comprising:

(a) at least one alkoxysilane represented by the above formula (I) and/or at least one halogenated silane alkoxysilane represented by the above formula (II), and (b) the readily decomposable resin dissolved in an organic solvent being insoluble in water, with addition thereto of water and an acid catalyst, or an aqueous solution containing the acid catalyst.

It is desirable that (i) at least one alkoxysilane and/or at least one halogenated silane and (ii) the easily decomposable resin are mixed in such a mixing ratio that the aforesaid weight ratio (A/B) of the hydrolyzate of alkoxysilane and/or halogenated silane (A) to the easily decomposable resin (B) can be attained in the polymer composition.

More specifically, the above method for preparing the interpenetrated polymer composition uses a solution comprising an organic solvent and water to be separated into two phases, and is operated by performing a hydrolysis reaction of alkoxysilane represented by the above formula (I) and/or halogenated silane represented by the above formula (II) at the interface between the organic solvent and water, and then extracting the hydrolyzate of the alkoxysilane and/or halogenated silane into the phase of the organic solvent having dissolved the readily decomposable resin therein.

As for the organic solvents to be used for dissolving the readily decomposable resin, any solvent may be employable without any specific limitation as long as they have a property of being insoluble in water. Examples of the organic solvents include ketones such as methylethylketone and methylisobutylketone, ethers such as ethylether and butylether, esters such as methylacetate, ethylacetate, methyllactate and ethyllactate, hydrocarbons such as hexane, cyclohexane and octane, and aromatic hydrocarbons such as toluene, xylene and mesitylene. Of these solvents, ketones such as methylisobutylketone are preferably employed from the viewpoints of solubility of the readily decomposable resin and the like.

The organic solvent is used in an amount sufficient to completely dissolve the readily decomposable resin, although its amount varies depending on the properties of the solvent and the readily decomposable resin to be employed. For example, when acrylic resin with an oxidative decomposability is used as the readily decomposable resin and methylisobutylketone is used as the organic solvent, the methylisobutylketone (C) is preferably mixed with the acrylic resin (D) at the weight ratio (C/D) of 1 to 10. The organic solvent may be heated up to a temperature of not higher than its boiling point to make dissolution of the readily decomposable resin easy. However, in such a case, it may be necessary for its use to cool it down to the temperature required for the catalytic hydrolysis reaction of alkoxysilane and/or halogenated silane as described above.

Although the alkoxysilane and/or halogenated silane can be used as it is, it is preferably used after having been dissolved in an organic solvent such as methylisobutylketone.

The organic solvent to be used for dissolving (i) the alkoxysilane and/or halogenated silane or (ii) the readily decomposable resin may be the same as or different from each of them, as long as there is no phase separation when they are mixed.

Water (E), which is necessary for the catalytic hydrolysis reaction, is preferably added at the weight ratio (E/F) of 0.1 to 2, more preferably 0.5 to 1.5, to the mixture (F) of the alkoxysilane and/or halogenated silane, the readily decomposable resin and the organic solvent contained in the solution. When water is added at the weight ratio of less than 0.1, the catalytic hydrolysis reaction becomes extremely slow, and when it is added at the weight ratio of more than 2, the catalytic hydrolysis reaction proceeds so rapidly that the resulting coating liquid tends to have poor stability with time.

As for the catalyst, an acid catalyst, which can exhibit acidity in an aqueous solution, is employed. Examples of the acid catalysts include inorganic acids such as hydrochloric acid, nitric acid and sulfuric acid, organic acids such as acetic acid, oxalic acid and toluenesulfonic acid, and metallic soap exhibiting acidity in an aqueous solution. The amount of the acid catalyst to be used varies depending on the type of the catalyst. For example, the inorganic acid catalyst (G) is preferably added at the weight ratio (G/H) of 0.0001 to 0.01, more preferably 0.001 to 0.01, to the mixture (H) of the alkoxysilane and/or halogenated silane, the readily decomposable resin and the organic solvent contained in the solution. When the inorganic acid catalyst is added at the weight ratio (G/H) of less than 0. 001, the catalytic hydrolysis reaction becomes extremely slow, and when it is added at the weight ratio of more than 0.01, the hydrolysis reaction proceeds so rapidly that the resulting coating liquid tends to have poor stability with time.

Although water and the acid catalyst can be added separately under the above conditions, it is preferable to use for the addition an aqueous solution containing the acid catalyst, which is a mixture of them. If the temperature of the aqueous solution is raised by a heat of reaction between water and the acid catalyst, it may be necessary to cool it down to the temperature required for the catalytic hydrolysis reaction as described below prior to the use thereof.

The catalytic hydrolysis reaction will be performed by adding water and the acid catalyst or an aqueous solution containing the acid catalyst to a mixed solution comprising (i) the alkoxysilane and/or halogenated silane and (ii) the readily decomposable resin dissolved in an organic solvent, and by agitating the solution at a temperature of up to about 80° C., more preferably 50° C. or below, for a period of 0.5 to 5 hours, more preferably 0.5 to 3 hours. Although water and the acid catalyst or the aqueous solution containing the acid catalyst may be added to the solution little by little over the above period of time, the whole amount thereof is preferably added at once in the beginning.

By the catalytic hydrolysis reaction described above, an interpenetrated polymer composition mainly constituted by (i) the hydrolyzate of alkoxysilane and/or halogenated silane and (ii) the readily decomposable resin, is prepared.

The coating liquid for forming a silica-containing film with a low-dielectric constant according to the present invention comprises a polymer composition, preferably an interpenetrated polymer composition, at a concentration of preferably 5 to 30% by weight, more preferably 10 to 25% by weight, in the coating liquid mainly consisting of the polymer composition and organic solvent.

As for the organic solvents, any of organic solvents such as ketones, ethers, esters, hydrocarbons and aromatic hydrocarbons as described above is employable without any specific limitation.

In the present invention, the solution comprising a polymer composition or an interpenetrated polymer composition together with other components, which has been obtained by the above process using an organic solvent being insoluble in water, may be used directly as the coating liquid. However, the coating liquid is preferably prepared by:

(a) separating the organic phase from the above solution which is in two phases consisting of an organic phase containing the organic solvent and the polymer composition or the interpenetrated polymer composition, and a water phase containing the alcohol as a by-product of the hydrolysis reaction and the acid catalyst, (b) replacing the organic solvent contained in the organic phase with an organic solvent such as methylisobutylketone by means of a rotary evaporator or the like, by which the alcohol, water and acid catalyst remaining in the organic phase can also be removed, and then (c) adjusting the concentration of the polymer composition or the interpenetrated polymer composition to be contained in the coating liquid into the amount as described above.

Furthermore, the coating liquid may include some amount of filler component such as a porous alumina, mica, kaolin and talc, which may be optionally added thereto.

The substrate coated with a silica-containing film according to the present invention can be obtained by (i) applying the above coating liquid onto the surfaces of any of various substrates, (ii) heating the thus coated film and then (iii) decomposing or vaporizing the readily decomposable resin as a constituent part of the polymer composition or the interpenetrated polymer composition contained in the film.

The coating liquid can be applied onto the substrate by the use of any customary techniques such as the spray method, spin coating method, dip coating method, roll coating method and transfer printing method.

The temperature for heating the coated film is preferably in the range of 50 to 200° C., more preferably 80 to 150° C. Furthermore, it is preferable that the heating be conducted in an atmosphere of inert gas such as nitrogen for a period of 1 to 10 minutes, depending on the thickness of the coated film and properties of the coating liquid.

This heating not only promotes the polymerization of components contained in the coating liquid to thereby effect baking thereof but also lowers the melt viscosity of polymerized components to thereby increase the re-flow property of a silica-containing film with a low-dielectric constant with the result that the planarity of the thus obtained silica-containing film is enhanced. The silica-containing film obtained from the coating liquid according to the present invention can maintain the re-flow property attributed to the low viscosity of the polymer component contained in the film up to about 150° C. Thus, a silica-containing film with highly enhanced planarity can be obtained.

Although it varies depending on the substrate to be coated and its target, the thickness of the silica-containing film with a low-dielectric constant formed in the above manner generally ranges from about 1000 to 2500 Å when formed on a silicon substrate of a semiconductor device and generally ranges from 3000 to 10000 Å when formed between wiring layers of a multi-level interconnect.

Decomposition or vaporization of the readily decomposable resin as a constituent part of the polymer composition or the interpenetrated polymer composition contained in the film formed on the substrate is carried out by subjecting the substrate to a thermal treatment or to an irradiation with ultraviolet radiation, infrared radiation, electron beam, X-ray or oxygen plasma. The decomposition of the readily decomposable resin may be an oxidative decomposition and/or a thermal decomposition.

The thermal treatment is conducted at a temperature of not higher than 500° C. and also of not lower than the temperature at which the readily decomposable resin is vaporized or decomposed. However, the temperature of the thermal treatment will be higher than the above temperature for heating the coated film. The thermal treatment is preferably conducted for a period of 10 to 30 minutes, although it varies depending on the type of readily decomposable resin, thickness of the coated film, etc. When the temperature of the thermal treatment is conducted over 500° C., an aluminum wiring or copper wiring of a semiconductor substrate coated with the coating liquid may be oxidized or melted, thereby damaging the wiring layer. Therefore, the thermal treatment is to be conducted at a temperature of not higher than 500° C.

When the readily decomposable resin is oxidatively decomposed by the thermal treatment, it is preferable to conduct the thermal treatment in an atmosphere of oxygen-containing gas. If the readily decomposable resin is a volatile material, the thermal treatment can be conducted either in an atmosphere of oxygen-containing gas or in an atmosphere of inert gas such as nitrogen, as long as a temperature which can vaporize the readily decomposable resin is employed.

When the readily decomposable resin is decomposed by an irradiation with ultraviolet radiation, infrared radiation, electron beam, X-ray or oxygen plasma, the irradiation will be conducted at a dose required to decompose or vaporize the resin for a period of time sufficient to do so. For example, the irradiation with ultraviolet radiation is preferably conducted at a dose of 10000 mJ, although it varies depending on the type of the readily decomposable resin, thickness of the coating film, etc.

By the above treatment, a silica-containing low-density film with a low-dielectric constant having essentially no pores or voids of more than 10 nm (100 Å) in diameter can be obtained. The thus obtained film has the characteristics of little soaking of etching gas components into the pores or voids at an etching stage and little deterioration of the film quality attributed to the irradiation of oxygen plasma, and has very high film strength.

To support the existence of such characteristics, the size of pores and voids present in the low-density film are measured more accurately by means of SEM (scanning electron microscope) method and BJH (Barrett-Joyner-Helenda) method. As a result, a confirmation is made that:

(a) no pores or voids with a size of more than 10 nm in diameter are observed in the film, (b) pores or voids with an extremely small size which can not be measured are likely to be formed in the film, (c) an average diameter of pores or voids measured by the BJH method is not more than 10 nm, and especially is not more than 5 nm in the film with a higher mechanical strength.

The above substrate coated with a silica-containing film with a low-dielectric constant according to the present invention is used in, for example, a semiconductor device, a liquid crystal display or a photomask with a phase shifter. Specifically, in the semiconductor device, the silica-containing film with a low-dielectric constant is formed, for example, on a silicon substrate, on a part between wiring layers of a multi-level interconnect, on an element surface or on a PN junction part.

A low-density insulating film having a dielectric constant as low as 3 or less and being excellent in etching performance, can be obtained by the use of the above coating liquid for forming a silica-containing film with a low-dielectric constant according to the present invention.

EXAMPLES

The present invention is now illustrated with reference to the following Examples, but such examples in no way limit the scope of the invention.

Example 1

Preparation of Coating Liquid

A mixed solution of 66.67 g of triethoxysilane (available from Shinetsu Chemical Industry Co., Ltd.) and 183.33 g of ethanol was prepared and then maintained at 20° C. 21.82 g of an aqueous solution of nitric acid (as a catalyst) with a concentration of 0.05% by weight, was added at once to the mixed solution, and a hydrolysis reaction of the triethoxysilane was performed at a temperature of 20° C. for about 1 hour with agitation at 500 rpm. Thereafter, a 10-fold amount of methylisobutylketone (MIBK) was added thereto, and then a solvent was replaced to MIBK by means of a rotary evaporator to completely remove the alcohols (consisting of the ethanol added and the alcohol as a by-product of the hydrolysis reaction) and water (including nitric acid) contained therein. Thus, a MIBK solution containing a hydrolyzate of triethoxysilane with a concentration of 20% by weight in terms of $SiO_2$ was obtained.

Then, 125 g of the thus obtained MIBK solution was mixed with a solution obtained by dissolving 25 g of an acrylic resin in 100 g of MIBK, to obtain 250 g of a coating liquid (1) for forming a silica-containing film. The number-average molecular weight of the acrylic resin used in this Example and also in the following Examples was 22,190 based on polystyrene.

Example 2

A mixed solution of 66.67 g of triethoxysilane and 183.33 g of MIBK was mixed with a solution obtained by dissolving 12.5 g of an acrylic resin in 112.5 g of MIBK. 500 g of an aqueous solution of nitric acid with a concentration of 0.05% by weight, was added at once to the mixed solution, and a catalytic hydrolysis reaction of the triethoxysilane was performed at a temperature of 20° C. for about 1 hour with agitation at 500 rpm to thereby obtain a polymer composition mainly constituted by a hydrolyzate of triethoxysilane and an acrylic resin. Thereafter, the organic phase (i.e. MIBK phase) was separated from the resulting solution, and then subjected to a solvent replacement by means of a rotary evaporator to completely remove the alcohol as a by-product of the hydrolysis reaction and water (including nitric acid) contained therein. Thus, a coating liquid (2) for forming a silica-containing film, which contains a hydrolyzate of triethoxysilane with a concentration of 20% by weight in terms of $SiO_2$, was prepared.

Example 3

A mixed solution of 66.67 g of triethoxysilane and 183.33 g of MIBK was mixed with a solution obtained by dissolving 25 g of an acrylic resin in 225 g of MIBK. 500 g of an aqueous solution of nitric acid with a concentration of 0.05% by weight, was added at once to the mixed solution, and a catalytic hydrolysis reaction of the triethoxysilane was performed at a temperature of 20° C. for about 1 hour with agitation at 500 rpm to thereby obtain a polymer composition mainly constituted by a hydrolyzate of triethoxysilane and an acrylic resin. Thereafter, the organic phase (i.e. MIBK phase) was separated from the resulting solution, and then subjected to a solvent replacement by means of a rotary evaporator to completely remove the alcohol as a by-product or the hydrolysis reaction and water (including nitric acid) contained therein. Thus, a coating liquid (3) for forming a silica-containing film, which contains a hydrolyzate of tri-ethoxysilane with a concentration of 20% by weight in terms of $SiO_2$, was prepared.

Example 4

A mixed solution of 56.82 g of methyltrimethoxysilane and 183.33 g of MIBK was mixed with a solution obtained by dissolving 12.5 g of an acrylic resin in 112.5 g of MIBK. 500 g of an aqueous solution of nitric acid with a concentration of 0.05% by weight, was added at once to the mixed solution, and a catalytic hydrolysis reaction of the methyltrimethoxysilane was performed at a temperature of 20° C. for about 1 hour with agitation at 500 rpm to thereby obtain a polymer composition mainly constituted by a hydrolyzate of methyltrimethoxysilane and an acrylic resin. Thereafter, the organic phase (i.e. MIBK phase) was separated from the resulting solution, and then subjected to a solvent replacement by means of a rotary evaporator to completely remove the alcohol as a by-product of the hydrolysis reaction and water (including nitric acid) contained therein. Thus, a coating liquid (4) for forming a silica-containing film, which contains a hydrolyzate of methyltrimethoxysilane with a concentration of 20% by weight in terms of $SiO_2$, was prepared.

Example 5

A mixed solution of 56.82 g of methyltrimethoxysilane and 183.33 g of MIBK was mixed with a solution obtained by dissolving 25 g of an acrylic resin in 225 g of MIBK. 500 g of an aqueous solution of nitric acid with a concentration of 0.05% by weight, was added at once to the mixed solution, and a catalytic hydrolysis reaction of the methyltrimethoxysilane was performed at a temperature of 20° C. for about 1 hour with agitation at 500 rpm to thereby obtain a polymer composition mainly constituted by a hydrolyzate of methyltrimethoxysilane and an acrylic resin. Thereafter, the organic phase (i.e. MIBK phase) was separated from the resulting solution, and then subjected to a solvent replacement by means of a rotary evaporator to completely remove the alcohol as a by-product of the hydrolysis reaction and water (including nitric acid) contained therein. Thus, a coating liquid (5) for forming a silica-containing film, which contains a hydrolyzate of methyltrimethoxysilane with a concentration of 20% by weight based on $SiO_2$, was prepared.

Example 6

A solution obtained by dissolving 20 g of silsesquioxane hydride prepared in accordance with the process disclosed in Example 1 of Japanese Patent Publication No. 47(1972)-31838 in 80 g of MIBK was mixed with a solution obtained by dissolving 200 g of an acrylic resin in 800 g of MIBK, to prepare a coating liquid (6) for forming a silica-containing film.

Comparative Examples 1 and 2

A coating liquid (7) containing a polysiloxane obtained by allowing fine particles of silica to react with a hydrolyzate of triethoxysilane but not containing any of the readily decomposable resin, was prepared in accordance with the process disclosed in Example 1 of Japanese Patent Laid-Open Publication No. 9(1997)-315812. A coating liquid (8), which is obtained by adding a gas-generating substance of 3,3'-dimethoxy-4,4'-diazidodiphenyl to an organic SOG (spinning on glass) material available from Hitachi Kasei K. K., was prepared in accordance with the process disclosed in Example 1 of Japanese Patent Laid-Open Publication No. 8(1996)-330300.

Examples 7 to 12. Comparative Examples 3 and 4

Substrate with a Silica-containing film

Each of the coating liquids (1) to (8) was applied by an Spinning coating method onto a test piece of silicon wafer (a semiconductor substrate) having a size of 6 inches and heated at 150° C. for 3 minutes in an atmosphere of nitrogen gas. Thereafter, a thermal treatment was conducted at 400° C. for 30 minutes in an atmosphere of oxygen-containing gas which is a nitrogen gas containing 5% by volume of oxygen to form a silica-containing film on the surfaces of the test pieces of silicon wafer.

Each of the resulting films was formed with a thickness of around 5000 Å.

To evaluate such films coated on the test pieces of silicon wafer, each of them was subjected to the following measurements:

(a) a dielectric constant to be measured by a mercury probe method for which a frequency of 1 MHz is used, (b) an amount of moisture adsorption into the film, to be measured by a TDS (thermal desorption mass spectroscopy) method after the film was subjected to an irradiation of oxygen plasma, (c) film strength to be measured by a Sebastian strength tester, and (d) an average diameter of pores or voids present in the film to be measured by BJH (Barrett-Joyner-Helenda) method.

The results are shown in Table 1.

TABLE 1

| | Coating liquid. | Dielectric constant. | Amount of moisture adsorption. | Sebastian strength. (MPa) | Average diameter of pores or voids. (nm) |
|---|---|---|---|---|---|
| Example 7 | (1) | 2.2 | small | 70 or more | 2.5 |
| Example 8 | (2) | 1.9 | small | 70 or more | 3.3 |
| Example 9 | (3) | 2.2 | small | 70 or more | 4.8 |
| Example 10 | (4) | 1.9 | small | 35 | 5.9 |
| Example 11 | (5) | 2.2 | small | 40 | 9.0 |
| Example 12 | (6) | 1.9 | small | 45 | 5.3 |
| Comparative Example 3 | (7) | 2.1 | large | 18 | 18 |
| Comparative Example 4 | (8) | 2.5 | large | 21 | 15 |

As it is apparent from Table 1, the films obtained from the coating liquids (1) to (6) exhibited a dielectric constant of not more than 3 and a considerably small amount of moisture adsorption into the films. However, it was observed that the films obtained from the coating liquids (4) and (5) have relatively lower Sebastian strength than those of the films obtained from the coating liquids (1) to (3). This may be caused by the presence of pores or voids with a relatively large diameter formed in such films with an existence of the Si—CH$_3$ groups originated from the methyltrimethoxysilane.

Furthermore, the film obtained from the coating liquid (6) containing silsesquioxane hydride was liable to re-flow at the heating stage. Therefore, a large amount of the readily decomposable resin was added to the coating liquid, by which a dielectric constant of about 2 was exhibited. However, the film strength measured by a Sebastian tester was not so high.

In contrast, the silica-containing films obtained from the coating liquids (7) and (8) exhibited a considerably large amount of moisture adsorption into the films and low film strength, although the dielectric constant thereof was not more than 3.

In the silica-containing films obtained from the coating liquids (1), (2), (3) and (6), pores or voids contained therein were measured by the BJH method. As a result, it was observed that such films have no pores or voids with a size of more than 10 nm in diameter. In the silica-containing films obtained from the coating liquids (4) and (5), pores or voids with a size of more than 10 nm in diameter were partially observed.

Furthermore, an average diameter of pores or voids present in each of the above silica-containing films was measured by the BJH method. As a result, it was observed that the average diameter of pores or voids present in the above silica-containing films having higher film strength than 70 MPa, which were obtained from the coating liquid (1) to (3), was not more than 5 nm.

From the above results, it has become clear that a substrate coated with a low-density film having a dielectric constant as low as 3 or less and being excellent in resistance to oxygen plasma and in process adaptation, can be provided with the coating liquid for forming a silica-containing film with a low-dielectric constant according to the present invention.

What is claimed is:

1. A coating liquid for forming a silica-containing film with a low-dielectric constant of 3 or less, comprising a polymer composition mainly constituted by (i) a hydrolyzate of at least one alkoxysilane represented by the following formula (I) and/or at least one halogenated silane represented by the following formula (II), and (ii) a readily decomposable resin, $$X_nSi(OR)_{4-n} \quad (I)$$

$$X_nSiX'_{4-n} \quad (II)$$

wherein X represents a hydrogen atom, a fluorine atom, an unfluorinated or fluorinated alkyl group of 1 to 8 carbon atoms, an aryl group or a vinyl group; R represents a hydrogen atom, an alkyl group of 1 to 8 carbon atoms, an aryl group or a vinyl group; X' represents a halogen atom; and n is an integer of 0 to 3.

2. The coating liquid for forming a silica-containing film with a low-dielectric constant as claimed in claim 1, wherein the polymer composition is an interpenetrated polymer composition in which (i) the hydrolyzate of alkoxysilane and/or halogenated silane and (ii) the readily decomposable resin are entangled in each other on the molecular chain level.

3. The coating liquid for forming a silica-containing film with a low-dielectric constant as claimed in claim 1, wherein the readily decomposable resin is a resin which is decomposed or vaporized by heating at a temperature of not more than 500° C. or by irradiating with ultraviolet radiation, infrared radiation, electron beam, X-ray or oxygen plasma.

4. The coating liquid for forming a silica-containing film with a low-dielectric constant as claimed in claim 1, wherein the readily decomposable resin has a number-average molecular weight of 500 to 50,000 in terms of polystyrene.

5. The coating liquid for forming a silica-containing film with a low-dielectric constant as claimed in claim 1, wherein the polymer composition is obtained by performing a catalytic hydrolysis reaction of alkoxysilane and/or halogenated silane in a solution comprising;
(a) at least one alkoxysilane represented by the above formula (I) and/or at least one halogenated silane represented by the above formula (II), and
(b) the readily decomposable resin dissolved in an organic solvent being insoluble in water,
with addition thereto of water and an acid catalyst or an aqueous solution containing the acid catalyst.

6. The coating liquid for forming a silica-containing film with a low-dielectric constant as claimed in claim 1, wherein the weight ratio (A/B) of the hydrolyzate of alkoxysilane and/or halogenated silane (A), in terms of SiO$_2$, to the readily decomposable resin (B) is preferably in the range of 1/0.1 to 1/20.

7. A substrate coated with a silica-containing film with a low-dielectric constant, which is a low-density film formed by;
applying the coating liquid for forming a silica-containing film with a low-dielectric constant as claimed in claim 1, onto a substrate,
heating the thus coated film, and then
decomposing or vaporizing the readily decomposable resin contained in the film by a heat treatment at a temperature of not higher than 500° C. or by an irradiation with ultraviolet radiation, infrared radiation, electron beam, X-ray or oxygen plasma.

8. The substrate coated with a silica-containing film with a low-dielectric constant as claimed in claim 7, wherein the average diameter of pores or voids present in the low-density silica film is not more than 5 nm.

9. The coating liquid for forming a silica-containing film with a low-dielectric constant as claimed in claim 2, wherein the readily decomposable resin is a resin which is decomposed or vaporized by heating at a temperature of not more than 500° C. or by irradiating with ultraviolet radiation, infrared radiation, electron beam, X-ray or oxygen plasma.

10. The coating liquid for forming a silica-containing film with a low-dielectric constant as claimed in claim 2, wherein the readily decomposable resin has a number-average molecular weight of 500 to 50,000 in terms of polystyrene.

11. The coating liquid for forming a silica-containing film with a low-dielectric constant as claimed in claim 3, wherein the readily decomposable resin has a number-average molecular weight of 500 to 50,000 in terms of polystyrene.

12. The coating liquid for forming a silica-containing film with a low-dielectric constant as claimed in claim 2, wherein the polymer composition is obtained by performing a catalytic hydrolysis reaction of alkoxysilane and/or halogenated silane in a solution comprising:
(a) at least one alkoxysilane represented by the above formula (I) and/or at least one halogenated silane represented by the above formula (II), and
(b) the readily decomposable resin dissolved in an organic solvent being insoluble in water,
with addition thereto of water and an acid catalyst or an aqueous solution containing the acid catalyst.

13. The coating liquid for forming a silica-containing film with a low-dielectric constant as claimed in claim 3, wherein the polymer composition is obtained by performing a catalytic hydrolysis reaction of alkoxysilane and/or halogenated silane in a solution comprising:

(a) at least one alkoxysilane represented by the above formula (I) and/or at least one halogenated silane represented by the above formula (II), and (b) the readily decomposable resin dissolved in an organic solvent being insoluble in water, with addition thereto of water and an acid catalyst or an aqueous solution containing the acid catalyst.

14. The coating liquid for forming a silica-containing film with a low-dielectric constant as claimed in claim 4, wherein the polymer composition is obtained by performing a catalytic hydrolysis reaction of alkoxysilane and/or halogenated silane in a solution comprising:

(a) at least one alkoxysilane represented by the above formula (I) and/or at least one halogenated silane represented by the above formula (II), and (b) the readily decomposable resin dissolved in an organic solvent being insoluble in water, with addition thereto of water and an acid catalyst or an aqueous solution containing the acid catalyst.

15. The coating liquid for forming a silica-containing film with a low-dielectric constant as claimed in claim 2, wherein the weight ratio (A/B) of the hydrolyzate of alkoxysilane and/or halogenated silane (A), in terms of $SiO_2$ to the readily decomposable resin (B) is preferably in the range of 1/0.1 to 1/20.

16. The coating liquid for forming a silica-containing film with a low-dielectric constant as claimed in claim 3, wherein the weight ratio (A/B) of the hydrolyzate of alkoxysilane and/or halogenated silane (A), in terms of $SiO_2$, to the readily decomposable resin (B) is preferably in the range of 1/0.1 to 1/20.

17. The coating liquid for forming a silica-containing film with a low-dielectric constant as claimed in claim 4, wherein the weight ratio (A/B) of the hydrolyzate of alkoxysilane and/or halogenated silane (A), in terms of $SiO_2$, to the readily decomposable resin (B) is preferably in the range of 1/0.1 to 1/20.

18. The coating liquid for forming a silica-containing film with a low-dielectric constant as claimed in claim 5, wherein the weight ratio (A/B) of the hydrolyzate of alkoxysilane and/or halogenated silane (A), in terms of $SiO_2$, to the readily decomposable resin (B) is preferably in the range of 1/0.1 to 1/20.

19. A substrate coated with a silica-containing film with a low-dielectric constant, which is a low-density film formed by:

applying the coating liquid for forming a silica-containing film with a low-dielectric constant as claimed in claim 2 onto a substrate, heating the thus coated film, and then decomposing or vaporizing the readily decomposable resin contained in the film by a heat treatment at a temperature of not higher than 500° C. or by an irradiation with ultraviolet radiation, infrared radiation, electron beam, x-ray or oxygen plasma.

20. A substrate coated with a silica-containing film with a low-dielectric constant, which is a low-density film formed by:

applying the coating liquid for forming a silica-containing film with a low-dielectric constant as claimed in claim 3 onto a substrate, heating the thus coated film, and then decomposing or vaporizing the readily decomposable resin contained in the film by a heat treatment at a temperature of not higher than 500° C. or by an irradiation with ultraviolet radiation, infrared radiation, electron beam, X-ray or oxygen plasma.

21. A substrate coated with a silica-containing film with a low-dielectric constant, which is a low-density film formed by:

applying the coating liquid for forming a silica-containing film with a low-dielectric constant as claimed in claim 4 onto a substrate, heating the thus coated film, and then decomposing or vaporizing the readily decomposable resin contained in the film by a heat treatment at a temperature of not higher than 500° C. or by an irradiation with ultraviolet radiation, infrared radiation, electron beam, X-ray or oxygen plasma.

22. A substrate coated with a silica-containing film with a low-dielectric constant, which is a low-density film formed by:

applying the coating liquid for forming a silica-containing film with a low-dielectric constant as claimed in claim 5 onto a substrate, heating the thus coated film, and then decomposing or vaporizing the readily decomposable resin contained in the film by a heat treatment at a temperature of not higher than 500° C. or by an irradiation with ultraviolet radiation, infrared radiation, electron beam, X-ray or oxygen plasma.

23. A substrate coated with a silica-containing film with a low-dielectric constant, which is a low-density film formed by:

applying the coating liquid for forming a silica-containing film with a low-dielectric constant as claimed in claim 6 onto a substrate, heating the thus coated film, and then decomposing or vaporizing the readily decomposable resin contained in the film by a heat treatment at a temperature of not higher than 500° C. or by an irradiation with ultraviolet radiation, infrared radiation, electron beam, X-ray or oxygen plasma.

* * * * *

UNITED STATES PATENT AND TRADEMARK OFFICE
CERTIFICATE OF CORRECTION

PATENT NO. : 6,451,436 B1
DATED : September 17, 2002
INVENTOR(S) : Michio Komatsu et al.

It is certified that error appears in the above-identified patent and that said Letters Patent is hereby corrected as shown below:

Column 5,
Line 15, "convention al" should read -- conventional --.
Line 23, "The for use" should read -- The readily decomposable resin for use --.
Line 35, "pore's or" should read -- pores or --.
Line 39, "to substrate" should read -- to a substrate --.

Column 7,
Line 43 "0. 001" should read -- 0.0001 --.

Column 15,
Line 24, "SiO$_2$to" should read -- SiO$_2$, to --.

Signed and Sealed this

Eighteenth Day of February, 2003

JAMES E. ROGAN
*Director of the United States Patent and Trademark Office*